United States Patent [19]
Kurata

[11] Patent Number: 6,091,313
[45] Date of Patent: Jul. 18, 2000

[54] MAGNETOSTATIC WAVE DEVICE INCLUDING MAGNETIC GARNET LAYER HAVING AN INCLINED SIDE FACE

[75] Inventor: Hitoyoshi Kurata, Chiba, Japan

[73] Assignee: TDK Corporation, Tokyo, Japan

[21] Appl. No.: 09/222,348

[22] Filed: Dec. 29, 1998

Related U.S. Application Data

[63] Continuation of application No. PCT/JP98/01176, Mar. 19, 1998.

[30] Foreign Application Priority Data

May 15, 1997 [JP] Japan .................................. 9-140891

[51] Int. Cl.[7] ........................................................ H01P 7/00
[52] U.S. Cl. ........................................ 333/219.2; 333/245
[58] Field of Search ..................... 333/202, 204, 333/205, 219, 219.2, 201, 245

[56] References Cited

U.S. PATENT DOCUMENTS

| | | | |
|---|---|---|---|
| 4,060,448 | 11/1977 | Nemiroff et al. | 216/22 |
| 5,191,308 | 3/1993 | Tsutsumi et al. | 333/202 X |
| 5,192,928 | 3/1993 | Murakami et al. | 333/219.2 |

FOREIGN PATENT DOCUMENTS

| | | |
|---|---|---|
| 49-74398 | 7/1974 | Japan . |
| 58-106814 | 6/1983 | Japan . |
| 60-26284 | 6/1985 | Japan . |
| 1-133818 | 9/1989 | Japan . |
| 4-115702 | 4/1992 | Japan . |
| 6-333771 | 12/1994 | Japan . |

*Primary Examiner*—Seungsook Ham
*Attorney, Agent, or Firm*—Oblon, Spivak, McClelland, Maier & Neustadt, P.C.

[57] ABSTRACT

For patterning a magnetic garnet layer formed on the surface of a non-magnetic garnet substrate, the magnetic garnet layer, an intermediate layer and a resist layer are formed in this order from the substrate side, the intermediate layer and the resist layer are shaped in the state of an island, and then the magnetic garnet layer is etched in a hot phosphoric acid solution, the intermediate layer being composed of a material which is more soluble in the hot phosphoric acid solution than the resist layer so that the etched magnetic garnet layer side face is formed as a gently inclined face and that a conductor pattern extending on both the non-magnetic garnet substrate and magnetic garnet layer surfaces can be formed without breaking, or a protective resist layer being formed on the reverse surface of the substrate so that the application angle of a magnetic field to the magnetic garnet layer surface can be accurately controlled.

2 Claims, 10 Drawing Sheets

Qu (S11 METHOD) AT A FREQUENCY OF 700 MHz

▲ : WHEN MAGNETIC GARNET LAYER SIDE FACE IS AN INCLINED FACE
● : WHEN MAGNETIC GARNET LAYER SIDE FACE IS PERPENDICULAR TO THE LAYER SURFACE

MAGNETOSTATIC WAVE DEVICE INCLUDING MAGNETIC GARNET LAYER HAVING AN INCLINED SIDE FACE

This application is a continuation of PCT/JP98/01176 filed Mar. 19, 1998.

TECHNICAL FIELD

The present invention relates to a magnetostatic wave device having a non-magnetic garnet substrate, a magnetic garnet layer and a magnetic field generator, and a process for the production thereof.

TECHNICAL BACKGROUND

A magnetostatic wave device is used in a voltage controlled oscillator (VCO), etc., mainly in a microwave band and a quasi-microwave band and has a magnetostatic wave element which generates a magnetostatic wave having a specific frequency depending upon a change in a high-frequency magnetic field.

FIG. 12A shows an example of configuration of a magnetostatic resonator, in which a magnetic garnet layer 6 is formed on part of the surface of a substrate 7 composed of a non-magnetic garnet and striplines 11 and 12 are formed on the surface of the magnetic garnet layer 6. Further, electrode pads 13 and 14 and a stripline 15 are formed on the surface of the substrate 7 with the magnetic garnet layer 6 being present between them. The electrode pads 13 and 14 are connected to ends of the striplines 11 and 12, respectively, and the stripline 15 connects the other ends of the striplines 11 and 12. Each stripline is provided for supplying RF signal for exciting a magnetostatic wave. One of the electrode pads, the electrode pad 14 is connected to a ground conductor, and the other electrode pad 13 is connected to an input/output.

As shown in FIG. 12B, the above magnetostatic wave resonator is disposed between a pair of magnetic poles 17a and 17b of a magnetic field generator. One of the magnetic poles, the magnetic pole 17a also works as a ground conductor. The magnetostatic wave resonator is bonded and fixed to a flat magnetic pole surface 18a of the above one magnetic pole 17a with an electrically conductive paste layer 19, and has a constitution in which a magnetic field perpendicular to the surface of the magnetic garnet layer 6 is applied to the magnetic garnet layer 6.

For example, JP-B-60-26284 and JP-B-58-106814 describe methods of patterning the magnetic garnet layer of the magnetostatic wave device. In these methods, a magnetic garnet layer having some pattern is formed by bonding and forming a resist layer which is composed of a material [$SiO_2$ or polyimide-containing heat-resistant polymer (PIQ: trade name, supplied by Hitachi Kasei), etc.] insoluble in hot phosphoric acid and has a predetermined pattern to/on part of the surface of the magnetic garnet layer, and then immersing the resultant laminate structure in a phosphoric acid solution having a temperature of several 10° C. to 200 and several 10° C. to etch that portion of the magnetic garnet layer on which no resist layer is formed.

DISCLOSURE OF THE INVENTION

In the above conventional patterning methods, that side face of the magnetic garnet layer which is near to its surface, i.e., a region present in the vicinity of the resist layer during the etching forms a nearly perpendicular inclined face, and a region in the vicinity of a substrate forms a relatively gently inclined face. As shown in FIG. 12A and FIG. 12B, the striplines 11, 12 and 15 and the electrode pads 13 and 14 are integrally formed as a Uletter-shaped conductor pattern extending on the surface of the magnetic garnet layer 6 and the surface of the substrate 7. If the surface of the magnetic garnet layer 6 and the substrate 7 have a height difference formed of a nearly perpendicular inclined face, therefore, there is a problem that the conductor pattern is liable to be broken in its vicinities.

Further, when the laminated structure is immersed in a hot phosphoric acid solution for patterning the magnetic garnet layer 6, the reverse surface of the substrate 7 (surface on which the magnetic garnet layer is not formed) is also etched, and as a result, the reverse surface of the substrate 7 is no longer flat or smooth due to a local difference in etching rate. There is therefore caused a problem that the reverse surface of the substrate 7 and the magnetic pole surface 18a are no longer in parallel with each other so that the application angle of a magnetic field to the surface of the magnetic garnet layer 6 deviates from an intended value.

The present invention has been made for overcoming the above problems of a conventional magnetostatic wave device. It is a first object of the present invention to form a conductor pattern extending on the non-magnetic garnet substrate and the magnetic garnet layer surface without any breaking. It is a second object of the present invention to accurately control the application angle of a magnetic field to the magnetic garnet layer surface.

The above objects are achieved by any one of the following constitution (1) to (12).

(1) A magnetostatic wave device comprising a substrate formed of a non-magnetic garnet, a magnetic garnet layer formed on a surface of the substrate and a magnetic field generator for applying a magnetic field to the magnetic garnet layer, the magnetic garnet layer having a side face formed into an inclined face and satisfying $$t/L = 0.08 \text{ to } 1.00$$

wherein L is a length of the inclined face in the horizontal direction and t is a thickness of the magnetic garnet layer.

(2) A process for the production of a magnetostatic wave device comprising a substrate formed of a non-magnetic garnet, a magnetic garnet layer formed on a surface of the substrate and a magnetic field generator for applying a magnetic field to the magnetic garnet layer, the process comprising the laminating step of forming a laminate having the magnetic garnet layer, an intermediate layer and a resist layer in this order from the substrate side on the surface of the surface of a substrate, the shaping step of shaping the intermediate layer and the resist layer in the form of an island and the etching step of immersing the substrate on which the laminate is formed in a hot phosphoric acid solution to selectively remove regions of the magnetic garnet layer which are not coated with the resist layer, the intermediate layer being composed of a material which is more soluble in the hot phosphoric acid solution than a material composing the resist layer.

(3) In the above (2) process for the production of a magnetostatic wave device, the hot phosphoric acid solution has a temperature of 150 to 230° C.

(4) In the above (2) or (3) process for the production of a magnetostatic wave device, the intermediate layer is composed of Cr.

(5) In the above (4) process for the production of a magnetostatic wave device, the intermediate layer has a thickness of 40 to 60 nm.

(6) In any one of the above (2) to (5) processes for the production of a magnetostatic wave device, the resist layer is composed of Au.

(7) In the above (6) process for the production of a magnetostatic wave device, the resist layer has a thickness of 0.2 to 1 μm.

(8) In any one of the above (2) to (7) processes for the production of a magnetostatic wave device, the magnetic garnet layer is mirror-polished after the etching step.

(9) In any one of the above (2) to (8) processes for the production of a magnetostatic wave device, a protective resist layer composed of a material which is less soluble in the hot phosphoric acid solution than the material for the substrate is formed on a reverse surface of the substrate before the immersion in the hot phosphoric acid solution.

(10) In the above (9) process for the production of a magnetostatic wave device, the protective layer is composed of Au.

(11) In the above (9) or (10) process for the production of a magnetostatic wave device, a binder layer is formed between the substrate and the protective layer.

(12) In the above (11) process for the production of a magnetostatic wave device, the binder layer is composed of Cr.

FUNCTIONS AND EFFECTS

In the present invention, for forming the magnetic garnet layer of a magnetostatic wave device by the etching using a hot phosphoric acid solution, an intermediate layer composed of a material which is more soluble in the hot phosphoric acid solution than a resist layer is formed between the magnetic garnet layer and the resist layer in advance. The hot phosphoric acid solution not only etches the magnetic garnet layer but also slightly etches the intermediate layer. The hot phosphoric acid solution therefore comes to etch that region of the magnetic garnet layer which has been coated with etched intermediate layer, and as a result, the side face of the magnetic garnet layer is formed into a gently inclined face. For this reason, when a conductor pattern extending on surfaces including a height-level-different portion formed by the substrate surface and the magnetic garnet layer surface which have a height level difference is formed, the conductor pattern is hardly broken off. In the present invention, the inclination angle of the side face of the magnetic garnet layer can be changed by changing materials for composing the intermediate layer.

Further, when the present invention is applied to a magnetostatic wave resonator to form the side face of the magnetic garnet layer into an inclined face, the $Q_u$ value by S11 measurement method can be improved.

As already described, when the magnetic garnet layer is etched, the reverse surface of the non-magnetic garnet substrate is also etched, and the reverse surface of the substrate is liable to be impaired in flatness and smoothness due to a local difference in etching rate. While the magnetic garnet layer is required to be disposed between a pair of magnetic poles of a magnetic field generator such that it has a predetermined angle, conventionally, it has been difficult to dispose the magnetic garnet layer at an intended angle due to the roughening of the reverse surface of the substrate. In contrast, in the present invention, a protective resist layer is formed on the reverse surface of the substrate, which can prevent the etching of the reverse surface of the substrate. For this reason, the reverse surface of the substrate and the magnetic pole surface where it is to be disposed can be maintained so as to be in parallel with each other, and the application angle of a magnetic field to the magnetic garnet layer surface can be easily maintained at an intended value.

In the present invention, when the magnetic garnet layer is mirror-polished after the magnetic garnet layer is formed by etching, the magnetic garnet layer side face roughened by the etching can be flattened and smoothened. Further, that region of the magnetic garnet layer side face which is forming a nearly perpendicular inclined face can be removed and roundishness can be imparted. The inclination of the magnetic garnet layer side face can be therefore moderated as a whole, and the effect on the prevention of breaking of the conductor pattern can be further enhanced.

JP-A-4-115702 proposes a magnetostatic wave device in which part or the whole of edge portion of a magnetostatic wave propagation medium (magnetic garnet layer) is displaced from a plane perpendicular to the propagation plane of a magnetostatic wave. That is, it is described that the edge portion of the magnetic garnet layer is formed as a tapered face like the magnetostatic wave device obtained according to the present invention. The above Publication describes an effect that its application to a filter or a resonator can inhibit a spurious mode.

In the above Publication, the method of forming the edge portion of the magnetic garnet layer as a tapered face is completely different from that in the present invention. In the above Publication, a substrate on which the magnetic garnet layer is formed is fixed at a predetermined angle with regard to a reference surface of a polishing tool, and polishing is carried out. However, it is impossible to apply the above polishing method to mass-production. That is, when magnetostatic wave elements are mass-produced, generally, a magnetic garnet layer formed on the entire surface of a non-magnetic garnet substrate (wafer or a chip obtaining by cutting it) is patterned to form many rectangular patterns for many elements, and conductor patterns are formed for the rectangular patterns, whereby many elements are obtained at the same time. In the method in which the polishing is carried out with maintaining a substrate at a predetermined angle with regard to the reference surface of a polishing tool, however, only rectangular patterns that are present in the vicinity of edge portion of the substrate can be objects that are polished. When the above polishing method is employed, therefore, it is required to separate each rectangular pattern by cutting the substrate after the magnetic garnet layer is patterned, carry out the polishing, and then form a conductor pattern with regard to each pattern by photolithography, or the like. The mass-production thereof is therefore substantially impossible.

In the above Publication, further, the taper angle is described to be 1 to 20°. However, the taper angle is outside the scope of the present invention, and the above-described effect of the present invention cannot be materialized. According to the above Publication, it is considered that the taper angle in the Publication refers to a displacement from perpendicularity (an inclination from a garnet layer edge face). In contrast, the inclination of side face of the magnetic garnet layer, defined in the present invention, refers to t/L shown in FIG. 3D. When t/L is used to express taper angles in the above Publication, they are calculated to be 2.75 to 57.3. When the t/L is as large as the above values, there is almost no effect on the prevention of breaking of a conductor pattern in the vicinity of edge portion of the magnetic garnet layer. Further, the above Publication describes nothing concerning an improvement in $Q_u$ value found when the edge face of the magnetic garnet layer in a resonator is displaced from perpendicularity.

The specification of Japanese Utility Model Application No. 63-28851 (Japanese Utility Model Laid-open Publication No. 1-133818) describes a magnetostatic wave element which is constituted so as to remove edge face reflection by forming a thin layer for propagating a magnetostatic wave such that the thickness thereof continuously decreases toward the edge face thereof. The invention described in the above specification is similar to the magnetostatic wave device obtained according to the present invention in that the thickness of the magnetic garnet layer is continuously decreased toward the edge face.

However, the above specification describes no method for forming the magnetic garnet layer so as to have the above form. Further, it is described that the effect of the invention described in the above specification is the removal of edge face reflection, and in the effect, the invention described in the above specification differs from the present invention which improves $Q_u$ value when applied to a resonator. The above specification describes that the depth of that portion of the magnetic garnet layer which changes in thickness, from an edge face, is required to be larger than the wavelength of a magnetostatic wave for attenuating the edge face reflection. The depth from an edge face in the above description refers to a distance from a position where an inclination starts to an edge portion in the magnetic garnet layer. The magnetostatic wave device of the present invention is intended mainly for use with a magnetostatic wave having a wavelength of 0.1 to 5 mm. If the distance from the inclination start point to the edge portion in an element intended for use in the above wavelength region is increased according to the above specification, it is no longer possible to downsize the element. For achieving the improvement of $Q_u$ value which is included in the effect of the present invention, it is not necessary to make the length of an inclined portion larger than the wavelength of magnetostatic wave. Differing from the invention described in the above specification, therefore, the present invention can downsize the element.

BEST MODES FOR PRACTICING THE INVENTION

Embodiments of the present invention will be explained in detail hereinafter.

In the present invention, there is produced a magnetostatic wave device having a substrate composed of a non-magnetic garnet, a magnetic garnet layer formed on a surface of the substrate and a magnetic field generator for applying a magnetic field to the magnetic garnet layer. The present invention includes the constitution I and the constitution II to be explained below.

Constitution I

The constitution I includes a laminating step, a shaping step and an etching step.

FIG. 1A to FIG. 1J show a series of steps in the constitution I.

Figure 1:
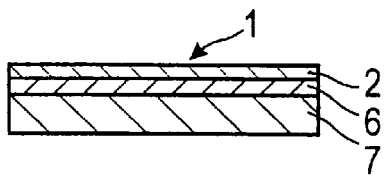
FIG. 1A to FIG. 1J are cross-sectional views for explaining constitution I in the process of the present invention.
Figure 1:
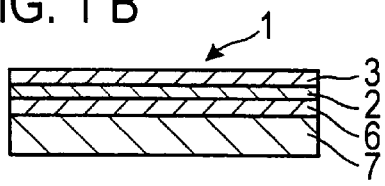
Figure 1:
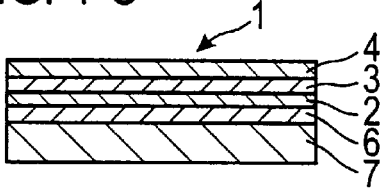
Figure 1:
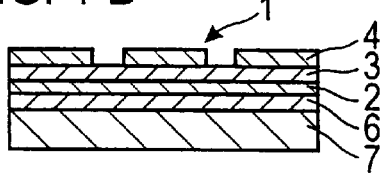
Figure 1:
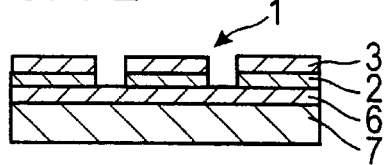
Figure 1:
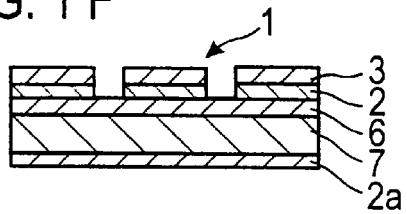
Figure 1:
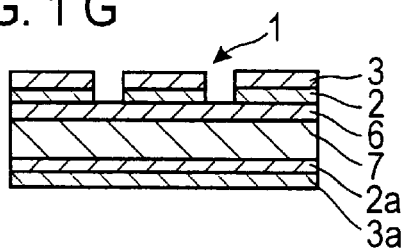
Figure 1:
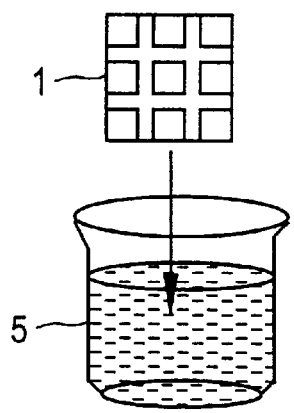
Figure 1:
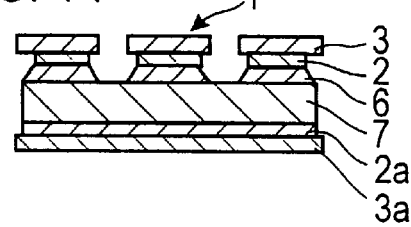
Figure 1:
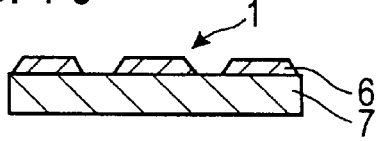

FIG. 1A and FIG. 1B are views for explaining the laminating step. In the laminating step, a laminate having a magnetic garnet layer 6, an intermediate layer 2 and a resist layer 3 in this order from a substrate side is formed on the surface of a substrate 7.

Specifically, first, as shown in FIG. 1A, a magnetic garnet layer 6 composed of YIG (yttrium.iron.garnet) or the like is formed on the surface of a substrate 7 composed of a non-magnetic garnet such as GGG (gadolinium.gallium.garnet) or the like by LPE (liquid phase epitaxial) method. The substrate generally has a thickness of approximately 0.05 to 0.4 mm. While the magnetic garnet layer 6 generally preferably has a thickness of approximately 5 to 30 μm, if the magnetic garnet layer 6 is polished in the constitution II to be described later, the thickness of the magnetic garnet layer 6 is preferably a little larger, or approximately 35 to 65 μm.

Then, as shown in FIG. 1B, an intermediate layer 2 is formed on the surface of the magnetic garnet layer 6, and a resist layer 3 is formed on the surface of the intermediate layer 2. Generally, the magnetic garnet layer 6 is formed on the surface of a non-magnetic garnet wafer. The intermediate layer and the resist layer may be formed when the substrate is in a wafer state, or they may be formed after a chip is taken from the wafer. An example shown in Figures show a case where each layer is formed on the surface of a chip 1 taken from a wafer. Although not specially limited, the length of each side of the chip may be generally about 10 mm.

The intermediate layer 2 is composed of a material which is more soluble in a hot phosphoric acid solution than a material used for constituting the resist layer 3. While the materials for the intermediate layer and the resist layer are not specially limited, the material for the intermediate layer is preferably Cr, and the material for the resist layer is preferably a metal material such as Au, an inorganic compound material such as $SiO_2$ or an organic material such as a polyimide-containing heat-resistant polymer (e.g., PIQ supplied by Hitachi Kasei). Of these materials, a combination of Cr for the intermediate layer and Au for the resist layer is the most preferred. The intermediate layer preferably has a thickness of 40 to 60 nm, and the resist layer preferably has a thickness of 0.2 to 1 μm. The method of forming each layer is not specially limited, and it may be determined depending upon a material to be used. When the metal material is used for composing each layer, it is preferred to use a vapor deposition method.

FIG. 1C, FIG. 1D and FIG. 1D illustrate the shaping step, in which the intermediate layer 2 and the resist layer 3 are shaped into the form of islands.

Specifically, first, a photoresist solution is applied onto the surface of the resist layer 3 by a spin coating method, etc., to form a layer having a thickness of approximately 2 to 9 μm. Then, the so-formed layer is pre-baked in an oven at approximately 85 to 90° C. for about 30 minutes, or it is pre-baked on a hot plate at approximately 90° C. for about 5 minutes, to form a photoresist layer 4 as shown in FIG. 1C.

Then, as shown in FIG. 1D, the photoresist layer 4 is patterned to a rectangular form having predetermined dimensions by exposure, development and rinsing with pure water.

Then, a chip 1 is immersed in an etching solution, to pattern the resist layer 3 and the intermediate layer 2 so as to form the same pattern as that of the photoresist layer 4. The etchant for each layer can be properly selected depending upon the material used for each layer. For example, when the resist layer 3 is composed of Au, it is preferred to use a mixture containing $NH_4I$, ethanol, iodine and water as an etchant for the resist layer. When the intermediate layer 2 is composed of Cr, it is preferred to use a solution of $Ce(NO_3)_2$ $NH_4NO_3$ in $HClO_4$ and a water as an etchant for the intermediate layer. After the patterning, the photoresist layer 4 is peeled with a peeling solution, and the chip 1 as a whole is fully washed to be brought into a state shown in FIG. 1E.

Then, the chip 1 is immersed in a hot phosphoric acid solution to etch the magnetic garnet layer 6. In the present invention, before the immersion of the chip 1 in the hot phosphoric acid solution, it is preferred to form a protective resist layer 3a on the reverse surface of the substrate 7 as shown in FIG. 1G.

The protective resist 3a is composed of a material which is less soluble in the hot phosphoric acid solution than the material composing the substrate 7. Specifically, the material for the protective resist 3a is preferably selected from those materials referred to in the explanation of the resist layer 3, and it is the most preferably composed of Au like the resist layer 3. The protective resist layer 3a preferably has a thickness in the same range as that of the resist layer 3.

When the adhesion between the protective resist layer 3a and the substrate 7 is not sufficient, for example, when the protective resist layer 3a is composed of Au, preferably, a binder layer 2a is formed on the reverse surface of the substrate 7 prior to the formation of the protective resist layer 3a, and the protective resist layer 3a is formed through the binder layer 2a. The binder layer 2a is composed of a material having good adhesion properties both to the substrate 7 and the protective resist layer 3a. For example, when the protective resist layer 3a is composed of Au, preferably, the binder layer 2a is composed of Cr like the intermediate layer 2. The binder layer 2a preferably has a thickness in the same range as that of the intermediate layer 2.

While it is proper that the binder layer 2a and the protective resist layer 3a should be formed before the chip is immersed in the hot phosphoric acid solution, it is preferred to form them after a state shown in FIG. 1E is attained, i.e., after the shaping step. The reason therefor is to prevent damage of the protective resist layer 3a. When the photoresist layer 4 in FIG. 1C is formed by spin coating, the reverse surface of the substrate 7 which is in contact with the plate surface of a spinner is liable to be rubbed to suffer damage due to the rotation of the spinner. When the protective resist layer 3a is already formed on the reverse surface of the substrate 7 before the formation of the photoresist layer 4, there is liable to be problem that the protective resist layer 3a is broken. In contrast, when the protective resist layer 3a is formed after the shaping step including the step of forming the photoresist layer 4, damage on the protective resist layer 3a can be prevented.

FIG. 1H illustrates the etching step. In the etching step, the chip 1 is immersed in a hot phosphoric acid solution 5 to selectively remove that region of the magnetic garnet layer 6 which is not coated with the resist layer 3 and the intermediate layer 2, whereby the magnetic garnet layer 6 is formed into the same pattern as that of the resist layer 3, and side faces of the patterned magnetic garnet layer are formed into inclined faces, to reach a state as shown in FIG. 1I.

The etching rate of the magnetic garnet layer depends upon the temperature of the hot phosphoric acid solution, and with an increase in the temperature, the etching rate increases. Further, the etching rate also depends upon the concentration of the hot phosphoric acid solution. When the etching amount of the magnetic garnet layer 6 is too large, undesirably, vicinities of the surface of the substrate 7 are etched. It is therefore preferred to control the etching time period depending upon the thickness of the magnetic garnet layer 6 with taking account of the temperature and the concentration of the hot phosphoric acid solution.

Figure 2:
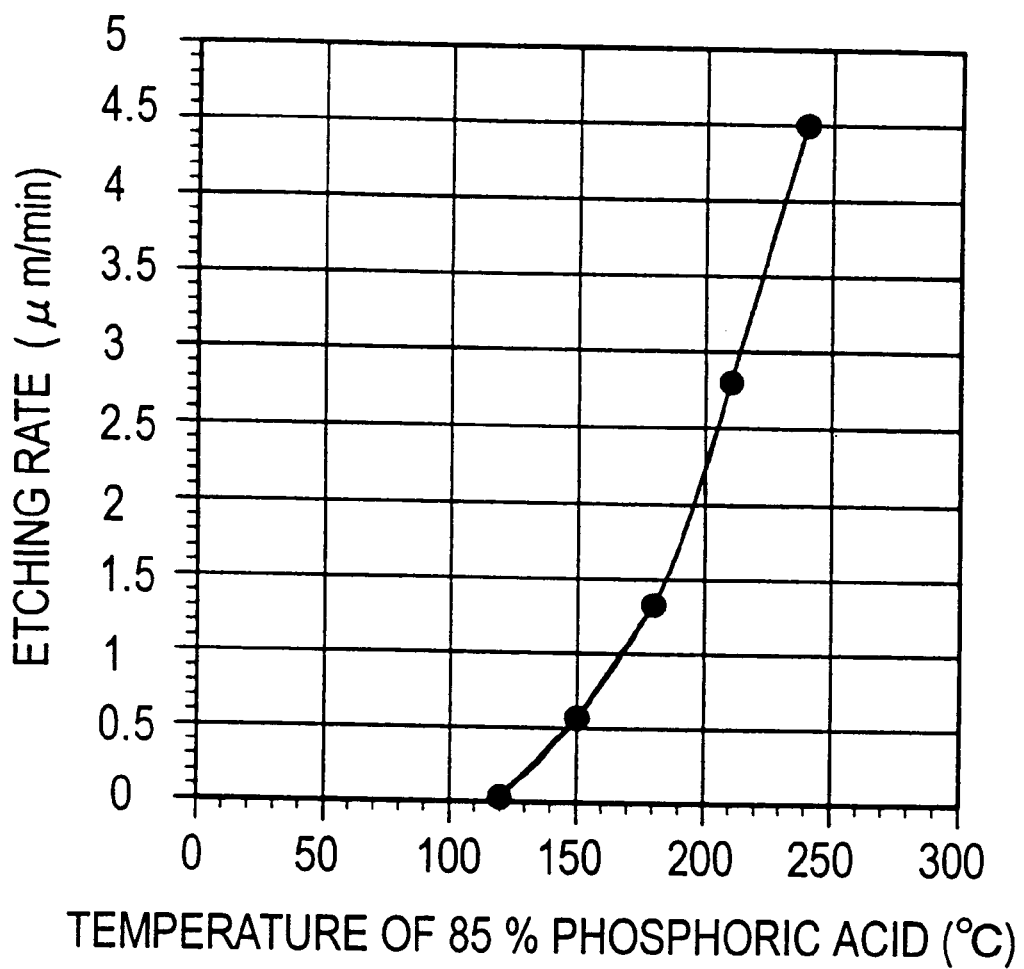
FIG. 2 is a graph showing a relationship between the temperature of a 85% hot phosphoric acid solution and the etching rate of a magnetic garnet layer.

Specific etching conditions can be experimentally determined. A relationship between the temperature of a 85% hot phosphoric acid solution and a magnetic garnet layer thickness etched per a unit time (minute) has been experimentally determined, and FIG. 2 shows the result. On the basis of experimental data like the above, the etching time for practicing the etching can be controlled depending upon the thickness of the magnetic garnet layer while maintaining a constant temperature of the hot phosphoric acid solution. For example, a hot phosphoric acid solution having a temperature of 200° C. is used, and when a magnetic garnet layer has a thickness of 5 μm, the etching time period can be set for about 2 minutes, or when a magnetic garnet layer has a thickness of 20 μm, the etching time period can be set for about 9 minutes, or when a magnetic garnet layer has a thickness of 30 μm, the etching time period can be set for about 13 minutes.

The temperature of the hot phosphoric acid solution is preferably 150 to 230° C.. When the magnetic garnet layer has a thickness in the preferred range which is already described, and when a hot phosphoric acid solution having a temperature lower than the above temperature range, undesirably, the etching time period is too long, or on the other hand, when a hot phosphoric acid solution having a temperature higher than the above temperature range, undesirably, diameters of pinholes existing in the resist layer may expand under heat and hot phosphoric acid solution may infiltrate therethrough to roughen the magnetic garnet layer surface. Further, when the temperature of the hot phosphoric acid solution is too high, the water content in the hot phosphoric acid solution sharply decreases to increase the viscosity of the solution, so that a heat convection does not smoothly takes place. The thermal distribution in the solution is therefore no longer uniform, and non-uniformity in etching is liable to be caused.

The etching is followed by the removal of the intermediate layer 2, the resist layer 3, the binder layer 2a and the protective resist layer 3a with respective etchants and washing, to give the magnetic garnet layer 6 which is independent in the state of an island on the substrate 7 and the side faces of the magnetic garnet layer 6 are formed into inclined faces, as shown in FIG. 1J. The dimensions of the patterned magnetic garnet layer 6 are preferably that each side is approximately 0.1 to 2 mm long. When the dimensions of the magnetic garnet layer are too large, its production cost increases, and the magnetostatic wave device is increased in size.

The reason why the side faces of the magnetic garnet layer 6 are formed into inclined faces, i.e., why the magnetic garnet layer 6 is shaped so as to have a trapezoidal form, will be explained with reference to FIGS. 3A to 3D.

Figure 3:
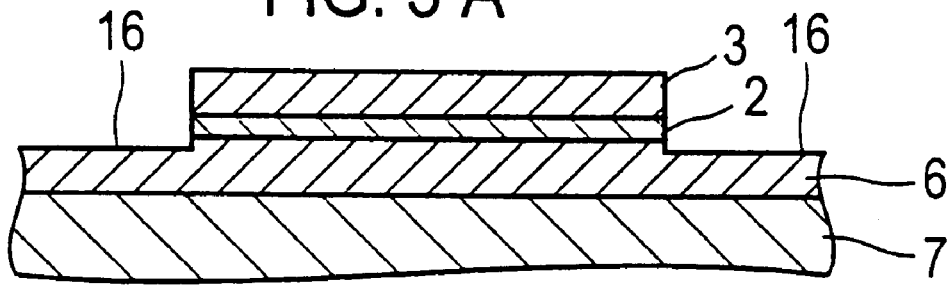
FIGS. 3A to FIG. 3D are cross-sectional views for explaining a process in which the side faces of a magnetic garnet layer are formed into inclined faces by etching.
Figure 3:
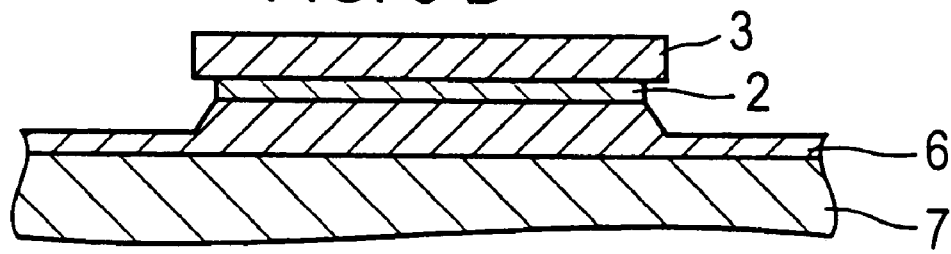
Figure 3:
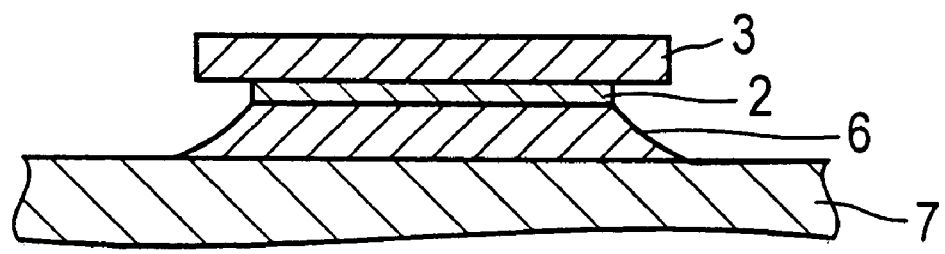
Figure 3:
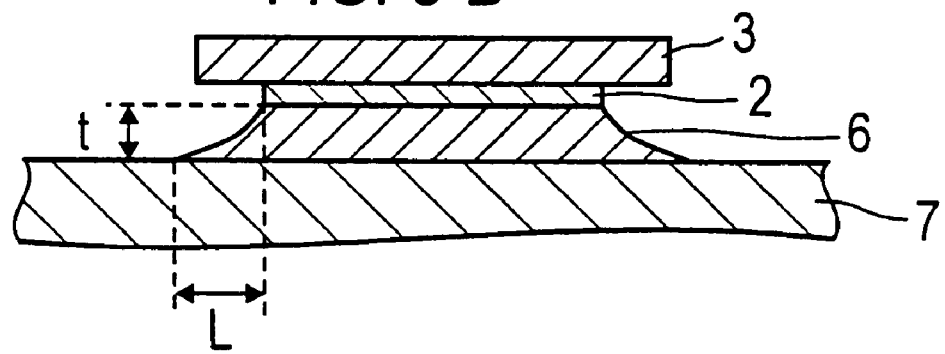

The hot phosphoric acid solution as an etchant for the magnetic garnet layer starts to etch that region 16 of the magnetic garnet layer 6 which is not coated with the intermediate layer 2/resist layer 3 as shown in FIG. 3A. Meanwhile, the intermediate layer 2 has a high solubility in hot phosphoric acid than the resist layer 3, and the intermediate layer 2 has a smaller thickness than the resist layer 3. For these reasons, with the passage of time after their immersion in the hot phosphoric acid, the intermediate layer 2 also starts to be dissolved as shown in FIG. 3B. As a result, a space is formed between the magnetic garnet layer 6 and the resist layer 3, the hot phosphoric acid solution starts to etch magnetic garnet layer 6 in the vicinity of the space, and the side face of the magnetic garnet layer 6 near edge portion of the intermediate layer 2 is moderately curved as shown in FIG. 3C. And, finally, the side face of the magnetic garnet layer is gently inclined in the vicinity of the surface of the substrate 7 and sharply inclined in the vicinity of the resist layer 3 as shown in FIG. 3D.

In the present invention, the inclination of the side face of the magnetic garnet layer 6 is represented by t/L which t and L are shown in FIG. 3D. L is a distance from a position where the inclination of the magnetic garnet layer starts to an end portion of the magnetic garnet layer, i.e., a length of an inclined face (side face) in the horizontal direction (direction in parallel with the surface of the substrate 7), and t is a thickness of the magnetic garnet layer 6.

In the present invention, $$t/L=0.08-1.00.$$

Preferably, $$t/L=0.17-8.84$$

When t/L is too large, the conductor pattern which is to supply RF signal for exciting magnetostatic wave is liable to be broken off near the side face of the magnetic garnet layer 6. On the other hand, when t/L is too small, the dimensions of the side face of the magnetic garnet layer come to be large excessively, and as a result, the magnetostatic wave device is increased in size and requires an additional cost. For example, when t/L is the lower limit value (0.08) in the above range, and if the magnetic garnet layer has a thickness of 5 $\mu$m, 2L is about 125 $\mu$m, or if the magnetic garnet layer has a thickness of 30 $\mu$m, 2L is about 750 $\mu$m. That is, it is seen that when t/L is smaller than the above lower limit, 2L (total of lengths of side faces in the horizontal direction) which affects the dimensions of the magnetic garnet layer greatly increases.

t/L can be controlled by the material composing the intermediate layer 2, the thickness of the resist layer 3, and the like. For example, with an increase in the solubility of the material composing the intermediate layer in an etchant, t/L decreases, and with a decrease in the above solubility, t/L increases. Further, with a decrease in the thickness of the resist layer 3, the resist layer comes to be easily taken off in the hot phosphoric acid solution, which promotes the etching of magnetic garnet layer below the resist layer 3, and t/L therefore decreases. On the other hand, with an increase in the thickness of the resist layer 3, t/L increases.

When the amount of the hot phosphoric acid solution 5 is small relative to the chip 1 in the step shown in FIG. 1H, the non-uniformity of temperature in the solution may cause a local difference in etching rate in some cases, and the etching may be effected to excess in some cases. It is therefore preferred to use the hot phosphoric acid solution in an amount sufficient for the chip. In an example shown in Figures, a chip taken from a wafer is immersed, while there may be employed a constitution in which the wafer as a whole is immersed if the amount of the hot phosphoric acid solution is sufficient.

Figure 4:
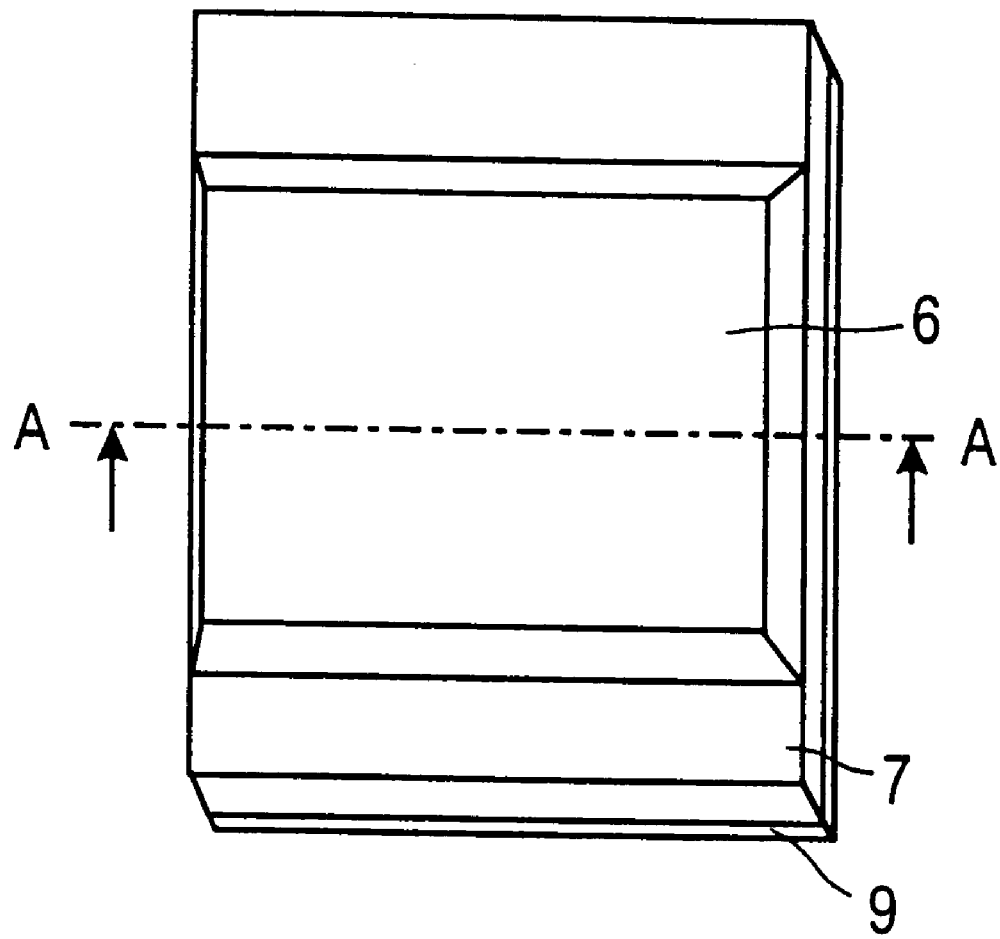
FIG. 4A is a perspective view of a magnetostatic wave element produced according the process of the present invention.
FIG. 4B is a cross-sectional view taken along line A—A in FIG. 4A.
Figure 4:
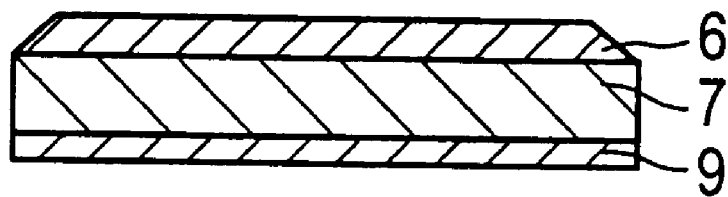

FIG. 4A and FIG. 4B show one example of a magnetostatic wave element produced as described above. FIG. 4A is a perspective view of the magnetostatic wave element viewed from above, and FIG. 4B is a cross sectional view taken along line A—A in FIG. 4A. The magnetostatic wave element is produced by forming a ground conductor layer 9 on the reverse surface of the substrate 7 by vapor deposition or the like after an element is taken from the chip 1 shown in FIG. 1J with a dicing saw.

Figure 5:
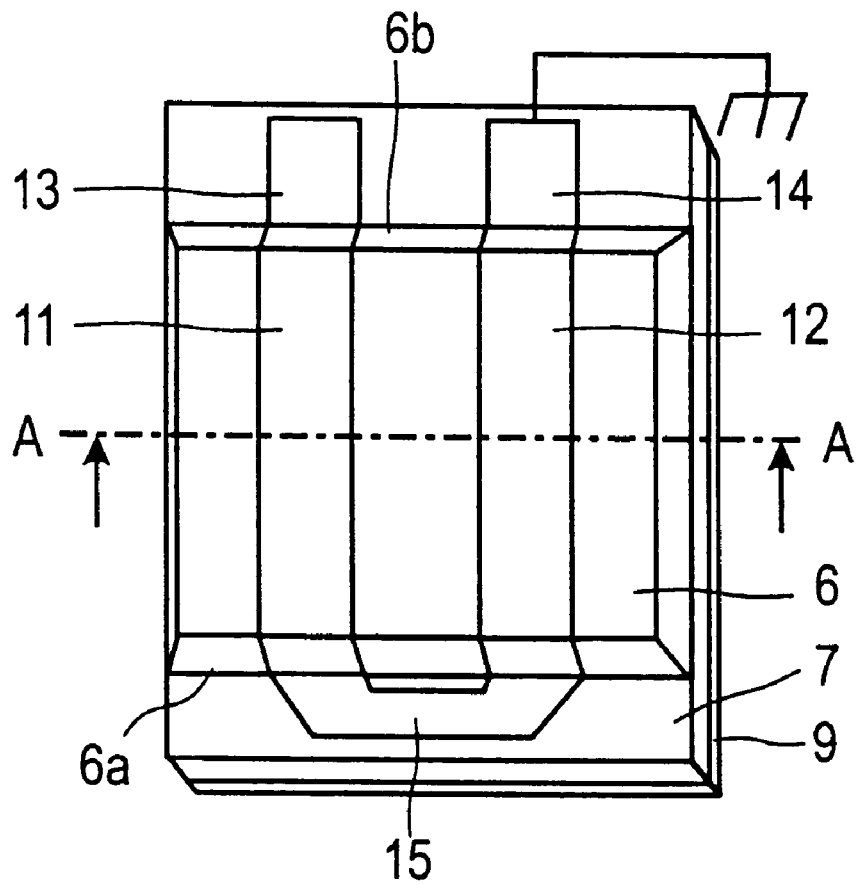
FIG. 5A is a perspective view of a magnetostatic wave resonator produced according to the process of the present invention.
FIG. 5B is a cross sectional view showing a relationship between a cross section of the magnetostatic wave resonator taken along line A—A in FIG. 5A and a magnetic field generator.
Figure 5:
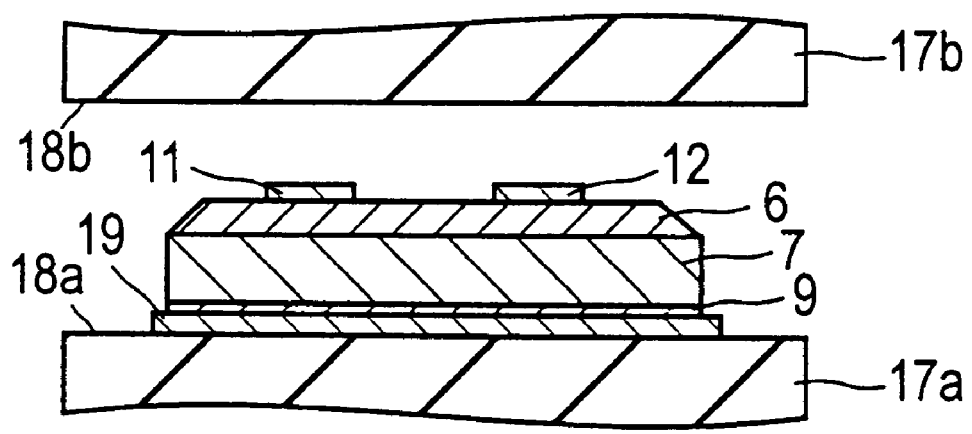

Striplines for supplying RF signal are formed on the above-produced magnetostatic wave element as shown in FIG. 5A and FIG. 5B, whereby a magnetostatic wave resonator is formed.

In the magnetostatic wave resonator shown by the perspective view of FIG. 5A, the magnetic garnet layer 6 is formed on part of the substrate 7, and striplines 11 and 12 are formed on the surface of the magnetic garnet layer 6. Further, electrode pads 13 and 14 and a stripline 15 are formed on the surface of the substrate 7 with the magnetic garnet layer 6 being present between them. The electrode pads 13 and 14 are connected to ends of the striplines 11 and 12, respectively, and the stripline 15 connects the other ends of the striplines 11 and 12. One of the electrode pads, the electrode pad 14 is connected to the ground conductor, and the other electrode pad 13 is connected to an input/output.

The striplines 11, 12 and 15 and the electrode pads 13 and 14 are integrally formed as a U-letter-shaped conductor pattern extending on the surface of the magnetic garnet layer 6 and the surface of the substrate 7. Since side faces 6a and 6b of the magnetic garnet layer 6 are gently inclined, there is no case in which the conductor pattern is broken near edge portions of the magnetic garnet layer 6. Generally, the conductor pattern is formed by forming a conductor layer by a vapor deposition method and patterning the conductor layer by photolithography.

FIG. 5B shows a cross sectional view in which the magnetostatic wave resonator shown in FIG. 5A is disposed between a pair of magnetic poles 17a and 17b of a magnetic field generator. FIG. 5B is a cross-sectional view of a magnetostatic wave resonator device, taken along line A—A in FIG. 5A. The magnetic poles 17a and 17b of the magnetostatic wave device also work as ground conductors, and the magnetostatic wave resonator is bonded and fixed to flat magnetic pole surface 18a of the magnetic pole 17a which is one of the above two magnetic poles, with an electrically conductive paste layer 19. The means of fixing the magnetostatic wave resonator to the magnetic pole surface shall not be limited to the electrically conductive paste.

The shown example has a constitution in which a magnetic field is perpendicularly applied to the surface of the magnetic garnet layer 6, while the magnetic pole surface 18a of the magnetic pole 17a and the magnetic pole surface 18b of the magnetic pole 17a may be faced to each other at any angle so that a magnetic filed can be applied to the layer surface of the magnetic garnet layer 6 at any angle.

In addition, a separation prevention layer may be formed between the intermediate layer 2 and the resist layer 3 for preventing the separation of these two layers. Some combination of materials for composing these two layers may make the adhesion of these two layers insufficient, and these two layers may separate during the etching in some cases. The separation during the etching can be prevented by composing the separation prevention layer of a material having excellent adhesion both to the material composing the intermediate layer and the material composing the resist layer.

Constitution II

FIGS. 6A to 6K show a series of steps in the constitution II. The constitution II has a polishing step added after the etching step of the constitution I, and it is the same as the constitution I in the other steps. That is, FIG. 6A to FIG. 6I and FIG. 6K are the same as FIG. 1A to FIG. 1I and FIG. 1J, respectively, and FIG. 6A to FIG. 6K include FIG. 6J for explaining the polishing step, added after FIG. 6I.

Figure 10:
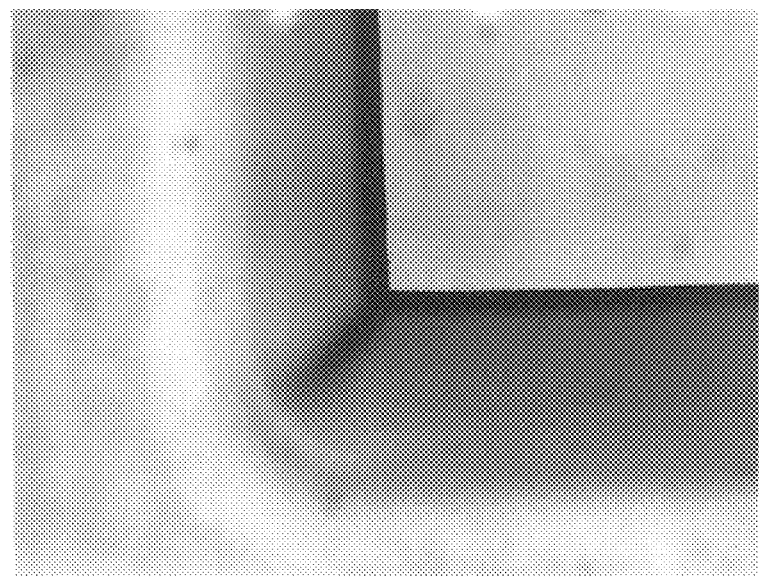
FIG. 10 is an optical microscope photograph showing appearances of the surface and the side face of a square-formed magnetic garnet layer obtained by etching, which is a substitute for a drawing for showing a fine pattern formed on a substrate.
Figure 11:
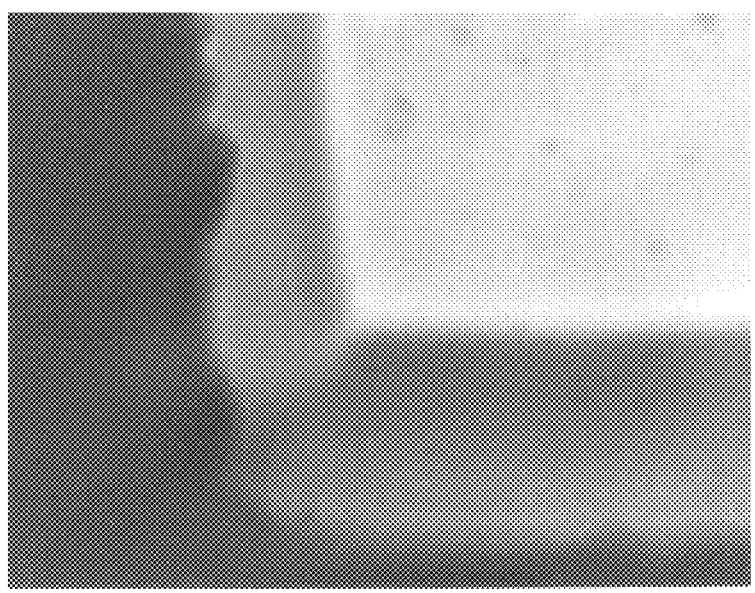
FIG. 11 is an optical microscope photograph showing appearances of the surface and the side face of a square-formed magnetic garnet layer obtained by etching and then mirror-polishing, which is a substitute for a drawing for showing a fine pattern formed on a substrate.
Figure 12:
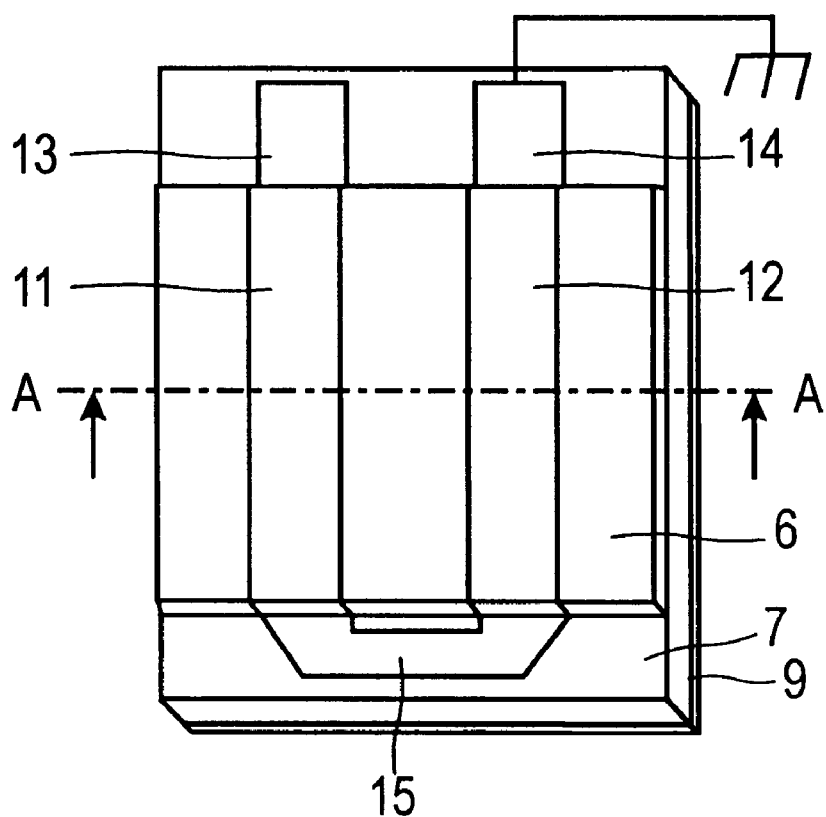
FIG. 12A is a perspective view of a conventional magnetostatic wave resonator.
FIG. 12B is a cross-sectional view showing a relationship between a cross section of the magnetostatic wave resonator taken along A—A in FIG. 12A and a magnetic field generator.
Figure 12:
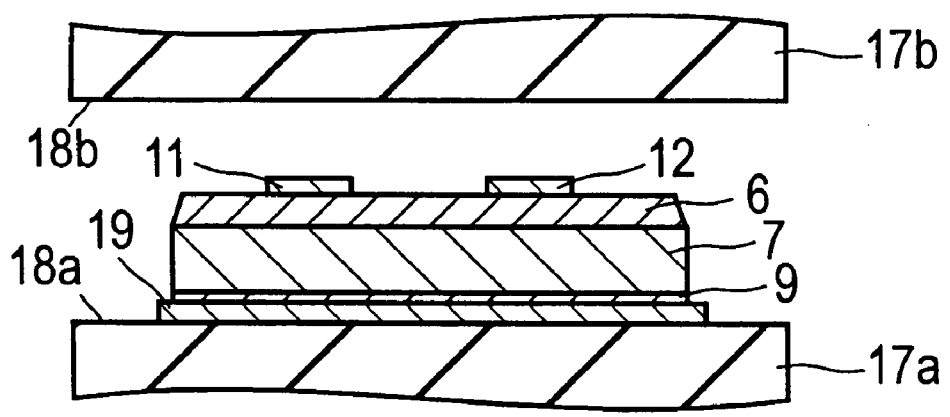

While the side face of the magnetic garnet layer is formed into an inclined face by etching, the side face is sharply inclined in the vicinity of the resist layer 3. In the constitution II, therefore, the surface of the magnetic garnet layer is polished in order to remove the sharply inclined region of side face of the magnetic garnet layer for forming a roundish face. When the side face of the magnetic garnet layer has a sharply inclined portion, the conductor pattern is liable to be broken near the portion. However, if the inclination of side face of the magnetic garnet layer is moderated by mirror-polishing, the breaking of the conductor pattern can be prevented. FIG. 10 shows an optical microscope photograph of an etched magnetic garnet layer, and FIG. 11 shows an optical microscope photograph of an etched and then mirror-polished magnetic garnet layer. In the magnetic garnet layer shown in FIG. 10, a boundary of the surface and the side face thereof is clearly observed. That is because the layer side face and the layer surface are nearly perpendicular to each other in the vicinity of the above boundary. In contrast, FIG. 11 shows a relatively unclear boundary of the layer surface and the layer side face. That is because the layer side face and the layer surface continue to each other at a moderate angle in the vicinity of the above boundary. FIG. 10 shows a layer before the dicing, and FIG. 11 shows a layer after an element is taken by dicing.

Specific procedures of the mirror polishing will be explained below.

The chip 1 of which the magnetic garnet layer side faces are formed into inclined faces by etching is fixed to a keeper 26 so as to allow the reverse surface side of the substrate 7 to face the keeper 26. In the shown example, a heat-melting tape 27 is used for the fixing, while an adhesive, or the like, may be used. In the shown example, further, the chip 1 is fixed to the keeper 26 in a state where the intermediate layer 2 and the resist layer 3 are not separated. This is because the steps of separating these two layers are omitted for simplifying the process. The steps of separating the intermediate layer and the resist layer may be provided as required after the etching and before the polishing.

Then, the magnetic garnet layer is polished with polishing grains 28. In the polishing, first, the magnetic garnet layer surface is lapped with polishing grains having a grain size approximately 8 μm in a first step, then, polished with polishing grains having a grain size of approximately 1 μm in a second step, and further, polished with polishing grains having a grain size of approximately ⅛ μm in a third step. Finish polishing is carried out in a fourth step in which the magnetic garnet layer surface is buff-polished with colloidal silica having a diameter of approximately 0.05 μm and a pad. Depending upon the degree of roughness of the magnetic garnet layer side face, the second to fourth steps excluding the first step may be carried out, or third and fourth steps alone may be carried out.

Figure 6:
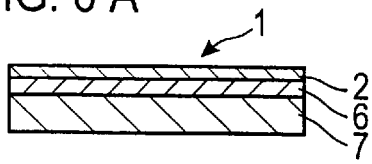
FIGS. 6A to 6K are cross-sectional views for showing constitution II in the process of the present invention.
Figure 6:
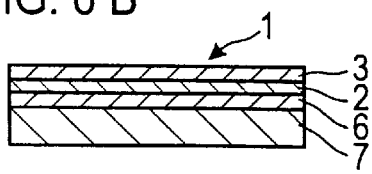
Figure 6:
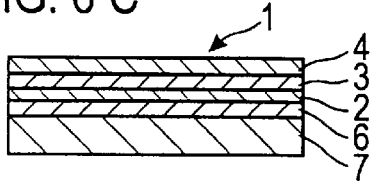
Figure 6:
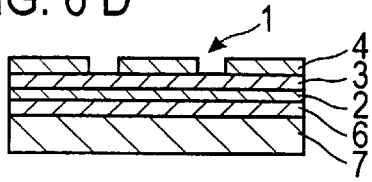
Figure 6:
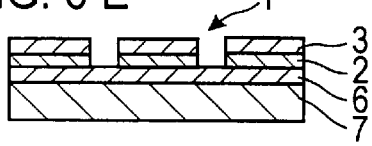
Figure 6:
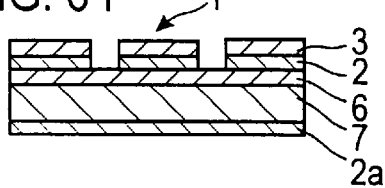
Figure 6:
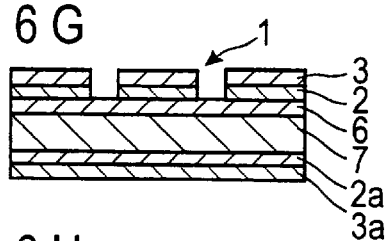
Figure 6:
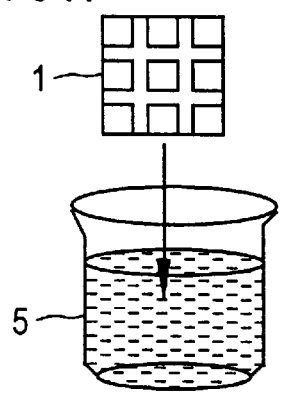
Figure 6:
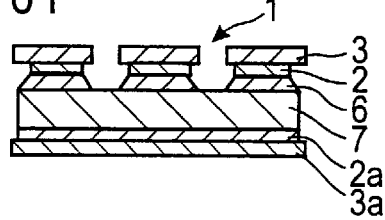
Figure 6:
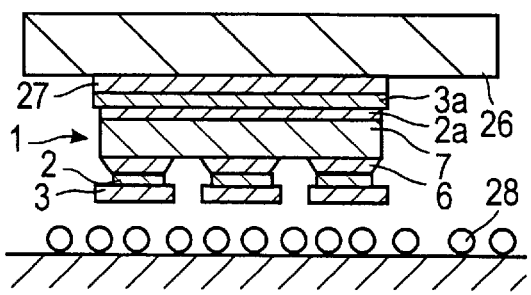
Figure 6:
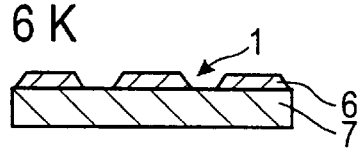

In the already described JP-A-4-115702, the magnetic garnet layer edge portions alone are polished with maintaining the substrate surface (magnetic garnet layer surface) at a predetermined angle with regard to the reference surface of a polishing tool, while the polishing step in the present invention differs from the counterpart described in the above Publication. In the present invention, the surface of the magnetic garnet layer 6 is polished as shown in FIG. 6J, and as a result, neighborhoods of edge portions of the magnetic garnet layer are polished to excess. When the polishing step is employed in the present invention, therefore, a decrease in the thickness of the magnetic garnet layer and the moderation of inclination of the magnetic garnet layer side faces are concurrently attained. As a consequence, the above t/L decreases due to the polishing. However, the t/L after the polishing is required to be in the above limitation range.

EXAMPLES

The present invention will be explained in detail with reference to specific Examples hereinafter.

Example 1 (Constitution I)

A magnetostatic wave element was prepared according to the procedures shown in FIG. 1A to FIG. 1J.

First, a magnetic garnet layer 6, an intermediate layer 2 and a resist layer 3 were consecutively formed on a substrate surface to reach a state shown in FIG. 1B. A GGG substrate was used as a substrate 7. The magnetic garnet layer was of YIG, and formed by an LPE method. The magnetic garnet layer 6 was formed so as to have a thickness of 17 μm. The intermediate layer was formed by vapor deposition of Cr. The intermediate layer was formed so as to have a thickness of 50 nm. The resist layer 3 was formed by vapor deposition of Au. The resist layer was formed so as to have a thickness of 0.2 μm.

A photoresist layer 4 was formed by selecting OFPR800 (supplied by Tokyo Ouka) as a photoresist, applying a solution thereof to form a coating having a thickness of 2 μm and pre-baking the coating in a circulating oven at 85 to 90° C. for 30 minutes. Then, the resist layer was patterned nearly in the form of squares by exposure, development and sufficient rinsing with pure water, to reach a state shown in FIG. 1D.

Then, the intermediate layer 2 and the resist layer 3 were patterned. As an Au etchant, there was used a solution prepared by dissolving 80 g of $NH_4I$ and 12 g of iodine in 600 ml of ethanol and 400 ml of water. As a Cr etchant, there was used a solution prepared by dissolving 51 g of $Ce(NO_3)_2 \cdot NH_4NO_3$ in 15 ml of $HClO_4$ and 300 ml of water. After the patterning, the resist layer 4 was peeled with a peeling solution, and a chip 1 as a whole was fully washed to reach a state in FIG. 1E.

Then, as a binder layer 2a, a Cr layer having a thickness of 50 nm was formed on the reverse surface of the substrate 7 by a vapor deposition method, and then, as a protective resist layer 3a, an Au layer having a thickness of 0.5 μm was formed by a vapor deposition method, to reach a state in FIG. 1G.

Then, as shown in FIG. 1H, the magnetic garnet layer 6 was etched by immersing the chip 1 in a 85% phosphoric acid solution 5 at 200° C., to reach a state in FIG. 1I. The time period for the etching was set for 7 minutes and 30 seconds.

After the etching, the resist layer 3 and the intermediate layer 2 were removed with respective etchants, followed by washing, to reach a state in FIG. 1J. Cu was vapor-deposited on the reverse surface of the chip 1 to form a conductor layer 9 having a thickness of 6 μm, whereby a magnetostatic wave element having a structure shown in FIG. 4A and FIG. 4B was obtained.

Figure 7:
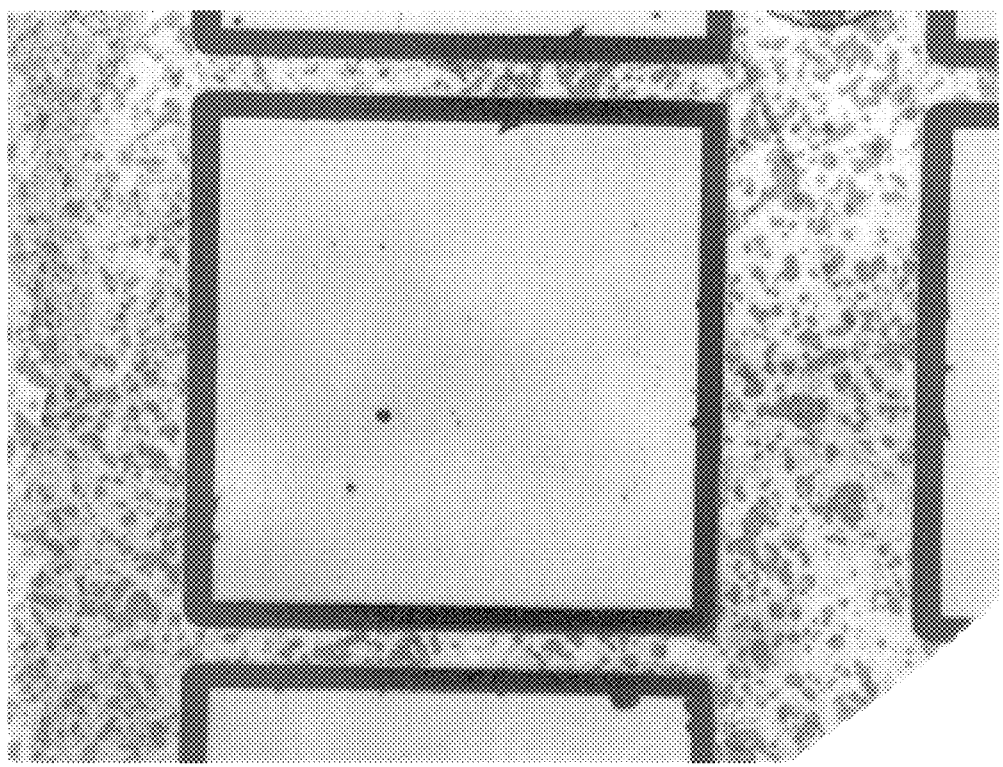
FIG. 7 is an optical microscope photograph of a magnetostatic wave element of the present invention, which is a photograph as a substitute for a drawing for showing a fine pattern formed on a substrate.

FIG. 7 shows an optical microscope photograph of the above magnetostatic wave element. The magnetic garnet layer patterned nearly in the form squares had side lengths of about 1 mm each. The magnetic garnet layer had a t/L, shown in FIG. 3D, of 0.5.

Cu was vapor-deposited on the surface of the above magnetostatic wave element (surface on the magnetic garnet layer 6 side) to form a conductor layer having a thickness of 6 μm, and the conductor layer was patterned by photolithography to give a magnetostatic wave resonator having a structure shown in FIG. 5A. One electrode pad was connected to a ground conductor, and the other electrode pad was connected to an input/output.

Then, as shown in FIG. 5B, the above magnetostatic wave resonator was fixed to a magnetic pole surface 18a of a magnetic pole 17a with an electrically conductive paste layer 19 such that a magnetic field was to be perpendicularly applied to the surface of the magnetic garnet layer 6.

Figure 9:
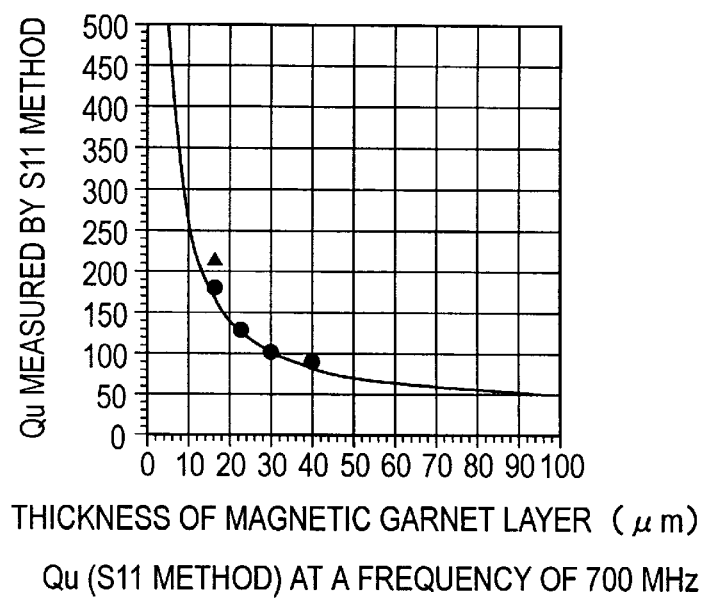
FIG. 9 is a graph showing $Q_u$ values determined on the basis of data obtained according to the S11 method.

The above magnetostatic wave resonator was measured for S11 with a network analyzer. FIG. 9 shows the result. Further, the magnetostatic wave resonator was measured for $Q_u$ value by the S11 method.

Figure 8:
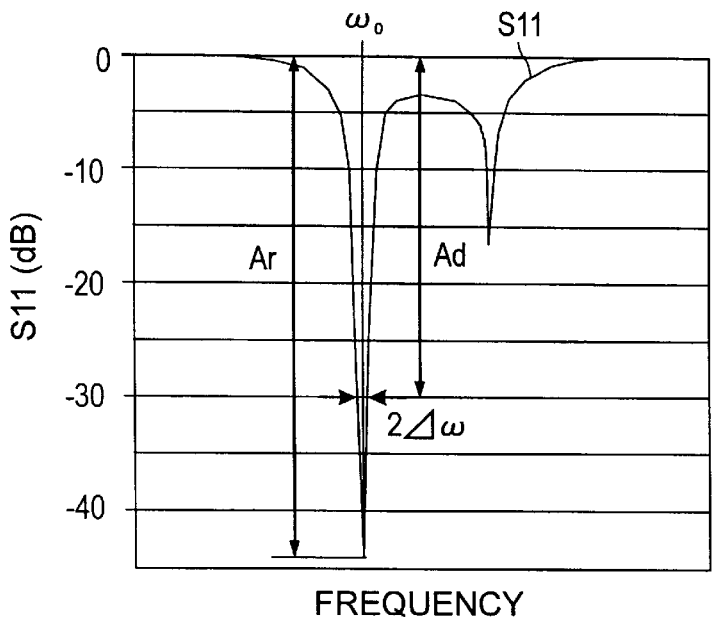
FIG. 8 is a graph for explaining the method of determining $Q_u$ value on the basis of data obtained according to the S11 method.

The method of the above measurement of $Q_u$ by the S11 method is explained on the basis of FIG. 8. First, S11 when the coupling coefficient of a resonator is nearly 1 is measured, S11 when no resonance occurs is used as a reference value (0 dB), and a resonance absorption peak value Ar based on the reference value is measured. Then, a width $2\Delta\omega$ of resonance absorption is measured at a point Ad which is at least −30 dB apart from the reference value. In this case, Ar is preferably smaller than Ad by 10 to 20 dB or more. Finally, a central frequency $\omega_0$ of resonance absorption is measured. $Q_u$ is determined by the following expression.

$$Q_u = (1+\beta) \cdot Q_L$$

$$Q_L = \omega_0 / (K \cdot 2\Delta\omega)$$

$$\beta = (1 - 10^{Ar/20}) / (1 + 10^{Ar/20}) \text{ when } \beta < 1$$

$$\beta = (1 + 10^{Ar/20}) / (1 - 10^{Ar/20}) \text{ when } \beta > 1$$

$$K^2 = (1 - 10^{Ar/10}) / (10^{Ad/10} - 10^{Ar/10})$$

FIG. 9 shows the so-obtained $Q_u$. For comparison, FIG. 9 also shows $Q_u$ values of resonators of which the magnetic garnet layer edge portions were cut perpendicularly to a substrate surface with a dicer. FIG. 9 shows that a resonator having a higher $Q_u$ value can be obtained by forming the side faces of the magnetic garnet layer into inclined faces.

Example 2 (Constitution 2)

Steps up to the etching step were completed according to procedures shown in FIG. 6A to FIG. 6I in the same manner as in Example 1. However, the magnetic garnet layer was formed so as to have a thickness of 50 μm.

Then, as shown in FIG. 6J, the protective resist layer 3a on the reverse surface side of the substrate 7 was fixed to a keeper 26 with a heat-melting tape 27. Then, the magnetic garnet layer surface was lapped with polishing grains having a grain size approximately 8 μm in a first step, then, polished with polishing grains having a grain size of approximately 1 μm in a second step, and further, polished with polishing grains having a grain size of approximately ⅛ μm in a third step. Finish polishing was carried out in a fourth step in which the magnetic garnet layer surface was buff-polished with colloidal silica having a diameter of approximately 0.05 μm and a pad.

FIG. 11 shows an optical microscope photograph of neighborhood of side face of the polished magnetic garnet layer. It is shown that the magnetic garnet layer side face shown in FIG. 11 is remarkably flat and smooth as compared with a magnetic garnet layer which was not polished after etching. The magnetic garnet layer shown in FIG. 10 had a thickness t and a t/L of 20 μm and 0.5, respectively, and the magnetic garnet layer shown in FIG. 11 had a thickness t and a t/L of 17 μm and 0.42, respectively. In addition, the magnetic garnet layer shown in FIG. 10 was thickness-decreased to 20 μm by polishing the magnetic garnet layer surface before its etching.

The above Examples clearly show the effects of the present invention.

What is claimed is:

1. A magnetostatic wave device comprising:

a substrate formed of a non-magnetic garnet;

a magnetic garnet layer formed on a surface of the substrate and comprising an inclined side face, wherein a conductive pattern disposed on said magnetic garnet layer and extends from said inclined face to said substrate, and satisfying t/L=0.08 to 1.00; and a magnetic field generator configured to apply a magnetic field to the magnetic garnet layer, wherein L is a length of the magnetic garnet layer measured from a beginning of the inclined side face to an end of the inclined side face in a direction parallel to the magnetic garnet layer and t is a thickness of the magnetic garnet layer and said inclined side face prevents breaking the conductive pattern on said magnetic garnet layer and said substrate.

2. The magnetostatic wave device according to claim 1, wherein t/L=0.17 ti 0.84.

* * * * *

UNITED STATES PATENT AND TRADEMARK OFFICE
CERTIFICATE OF CORRECTION

PATENT NO. : 6,091,313
DATED : 07/18/00
INVENTOR(S): HITOYOSHI KURATA

It is certified that an error appears in the above-identified patent and that said Letters Patent is hereby corrected as shown below:

In Claim 1, line 6, after "inclined" insert --side--.

In Claim 2, line 3, change "ti" to --to--.

Signed and Sealed this

Tenth Day of April, 2001

Attest:

NICHOLAS P. GODICI

Attesting Officer     Acting Director of the United States Patent and Trademark Office